: US 6,399,151 B2
(45) Date of Patent: *Jun. 4, 2002

(54) DIAMOND FILM DEPOSITING APPARATUS AND METHOD THEREOF

(75) Inventors: Wook-Seong Lee, Euijeongbu; Young Joon Baik; Kwang Yong Eun, both of Seoul, all of (KR)

(73) Assignee: Korea Institute of Science and Technology, Seoul (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/427,897

(22) Filed: Oct. 27, 1999

(30) Foreign Application Priority Data

Apr. 6, 1999 (KR) ............................................. 99-11854

(51) Int. Cl.[7] ................................................. C23C 16/27
(52) U.S. Cl. ...................... 427/249.8; 427/569; 427/577
(58) Field of Search ................................. 427/577, 569, 427/249.1, 249.8, 255.28

(56) References Cited

U.S. PATENT DOCUMENTS

| 5,314,570 | A | | 5/1994 | Ikegaya et al. | |
| 5,352,493 | A | * | 10/1994 | Dorfman et al. | 427/530 |
| 5,535,906 | A | * | 7/1996 | Drummond | 216/67 |
| 5,584,974 | A | | 12/1996 | Sellers | |
| 5,616,373 | A | * | 4/1997 | Karner et al. | 427/577 |
| 5,647,964 | A | * | 7/1997 | Lee et al. | 204/298.12 |
| 5,718,813 | A | | 2/1998 | Drummond et al. | |
| 5,747,118 | A | * | 5/1998 | Bunshah et al. | 427/577 |
| 5,879,741 | A | * | 3/1999 | Itoh et al. | 427/172 |
| 6,248,400 | B1 | * | 6/2001 | Kurihara et al. | 427/249.8 |

FOREIGN PATENT DOCUMENTS

JP 6-305886 * 11/1994

OTHER PUBLICATIONS

Samokhvalov, et al.,(1997)"Diamond growth on a large area and some aspects of diamond nucleation", Diamond and Related Materials 6, Elsevier Science S.A., pp. 426–429.

Suzuki, et al.,(1987)"Growth of diamond thin films by dc plasma chemical vapor deposition", Journal of Applied Physics Letter, American Institute of Physics, vol. 50, pp. 728–729.

* cited by examiner

Primary Examiner—Michael Barr
(74) Attorney, Agent, or Firm—Scully, Scott, Murphy & Presser

(57) ABSTRACT

A diamond film depositing apparatus and method are disclosed in which a uniform and large plasma is formed on a substrate having a diameter of larger than 100 mm without using a heated filament cathode, without applying a magnetic field thereto, and without using a ballast resistance. The thusly formed plasma is maintained stably for a long time, so that a diamond thick film having a diameter of larger than 4 inches and a thickness of over hundreds of $\mu$m can be deposited on a flat or curved substrate and also on a Si wafer.

4 Claims, 4 Drawing Sheets

DIAMOND FILM DEPOSITING APPARATUS AND METHOD THEREOF

BACKGROUND OF THE INVENTION

1. Field of the Invention

The present invention relates to a diamond film depositing apparatus and a method thereof, and more particularly, to a diamond film depositing apparatus and a method thereof which are capable of depositing a diamond thick film having a thickness of more than hundreds of $\mu$m on a large substrate having a diameter larger than 4 inches.

2. Description of the Conventional Art

A DC PACVD (Direct Current Plasma Assisted Chemical Vapor Deposition) method, one of the generally known diamond film deposition methods, is notable for its advantages in that the apparatus for DC PACVD is simple and its depositing speed is faster than hot filament or microwave CVD techniques.

It is constructed that a pair of platy electrodes are disposed, facing parallel to each other within a vacuum in a reaction container and a DC voltage is applied between the two electrodes to generate a plasma, and this plasma is used to ionize a reactive gas introduced into the reaction container, so that a diamond film is deposited on a substrate placed on an anode. In this respect, a disk-type electrode is largely used, and the reactive gas is a mixture of hydrogen and hydrocarbon. However, this technique suffers problems in that a long-time deposition is difficult due to instability or a loss of plasma caused by arc generation, and in that it is hardly possible to enlarge the area of a uniform deposition larger than 1 inch by using a single cathode. These problems prevent synthesizing a diamond thick film having a diameter larger than 4 inches and a thickness of more than hundreds of $\mu$m using a single cathode. That is, in the conventional art, it has been difficult to form a large plasma by using a single cathode for a large substrate having a diameter of larger than 4 inches, and even if such a plasma was successfully formed, it was difficult to keep it stable for a long time.

In the DC PACVD method, the temperature of the cathode and that of the substrate work as critical deposition variables. Varying the temperature of the cathode and the substrate over a wide range is very important during depositing. To be described in detail later in the description of the present invention, the cathode and substrate should be maintained not to go beyond a predetermined temperature range. The cathode is heated by the collision of ions from the plasma and the substrate by the collision of electrons. In a given structure for a cathode and a holder, the temperatures of the cathode and substrate are varied in accordance with the process conditions. In the conventional art, a general method for varying the temperatures of the cathode and substrate is seen in a manner that the cathode and the substrate are mounted on a water-cooled holder and a spacer is inserted between the holder and the cathode or the substrate, to thereby control the heat transfer. In this respect, if the temperature of the cathode and substrate could be varied by external operation outside a chamber during the process, it would be very convenient because there would be no need to discontinue the process to change the spacer. However as to the DC PACVD method, no technique has been reported to vary the temperatures of a cathode and a substrate during the process of depositing.

Conventionally deposition of a diamond thick film of hundreds of $\mu$m in thickness regarding the single-cathode DC PACVD is only obtained when the deposition area is quite small, about 1 square cm. On the other hand, where deposition of a wide area as large as 4 inches in diameter was achieved, it was not the desirous diamond thick film having the thickness of hundreds of $\mu$m, nor the continuous film but merely the formation of diamond particles, for which the plasma is rotated by applying a magnetic field. In other disclosed cases of attaining both the enlargement of area and the thick film deposition, employed a hot filament method was and used a plurality of filaments as a cathode. This method does not use a pair of facing plate-shape electrodes, and thus has an intrinsic problem of difficulty in filament maintenance, the basic defects in the hot filament technique.

Most of the conventional art techniques employ a ballast resistance connected in series to the power supply which serves to stabilize the plasma. The ballast resistance, having a similar resistance value to a load value of the plasma, is disadvantageous in that it unnecessarily wastes power because of its series connection to the circuit. That is, a large of percentage of the supply power is wasted in the ballast resistance, deteriorating the power efficiency. Nonetheless, the reason why the ballast resistance is in frequent use is that the plasma of the DC PACVD is hardly maintained stably for a long time using only the power supply.

The most conventional DC PACVD methods employ a flat-plate-type substrate. Meanwhile, some fields such as for radomes or diaphragms require that the diamond be deposited on a spherical surface. In addition, in some cases, deposition is needed on a cylindrical curved surface such as the internal and external surfaces of a tube, or an external surface of a bar. The conventional art of DC PACVD using a pair of electrodes does not disclose such a diamond deposition performed on a curved surface.

In the conventional DC PACVD methods, a thick plate of high melting point material such as molybdenum or tungsten is widely utilized as a substrate. If a silicon substrate in general use for the semiconductor fabrication is applicable thereto, it may be possible to be applied to the fields of SOD (Silicon On Diamond) and SAW (Surface Acoustic Wave) devices. Yet, there is not known a case where the diamond film is deposited on a silicon substrate having a diameter of 4 inches. The reason is believed to be that since the silicon substrate has a low thermal conductivity, being thin and light, a thermal contact between the silicon substrate and a substrate holder is not effectively made, resulting in that maintaining of an even temperature is impossible during synthesizing.

SUMMARY OF THE INVENTION

Therefore, the present invention is directed to provide a diamond depositing apparatus which is capable of forming a uniform and large plasma on a substrate having a diameter of over 100 mm and keeping it stable, without using a hot filament as a cathode, without applying an additional magnetic field, and without using a ballast resistance, to thereby deposit a diamond thick film having a thickness of over hundreds of $\mu$m and having a diameter of larger than 4 inches on a flat-surfaced substrate, a curve-surfaced substrate and on a Si wafer, and to a method thereof.

To achieve these and other advantages, the diamond film depositing apparatus in accordance with the present invention, as embodied and broadly described herein comprises: a process chamber having a gas inlet that injects a reactive gas and a gas exhaust outlet that discharges an exhaust gas; a cathode disposed at an internal upper portion of the process chamber; an anode for absorbedly fixing a substrate, the anode being disposed at a lower portion of the cathode; a switched-mode power supply(SMPS) for forming a plasma between the cathode and the anode by applying a DC voltage to the cathode and the anode, the SMPS being connected to both the cathode and the anode; and a holder for fixing the cathode to the upper portion of the process chamber and controlling a temperature of the cathode, wherein the size of the cathode and the anode is larger than 100 mm in diameter.

There is also provided a diamond film depositing method comprising the steps of: applying a DC or DC pulse voltage to a cathode and the anode disposed inside a vacuum chamber; generating a plasma between the cathode and the anode by supplying a reactive gas therebetween; and depositing a diamond film on a substrate by constantly maintaining a gas pressure, while keeping the temperature of the cathode below 2000° C.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

Figure 1:
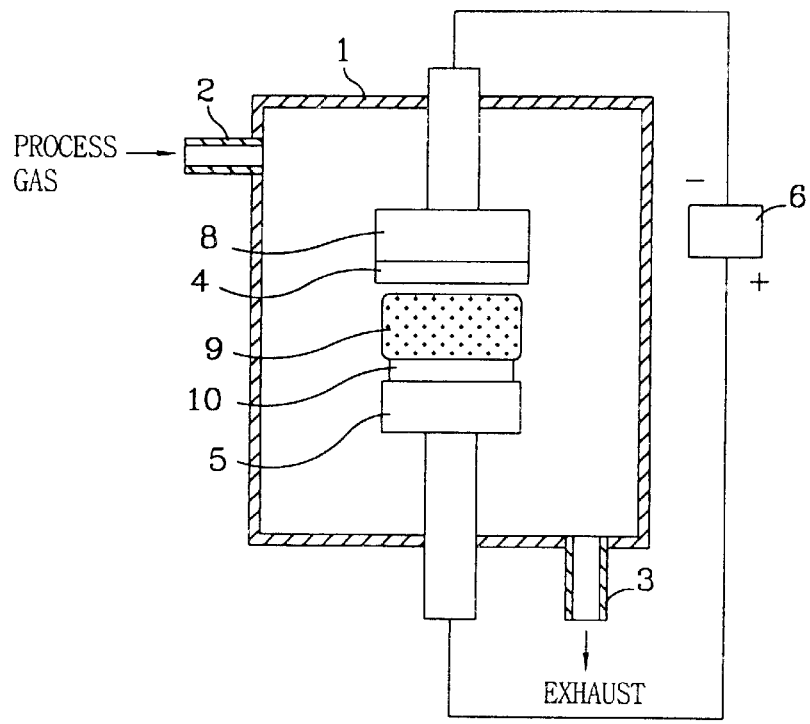
FIG. 1 is a schematic view of the structure of a diamond film depositing apparatus in accordance with the present invention.
Figure 2:
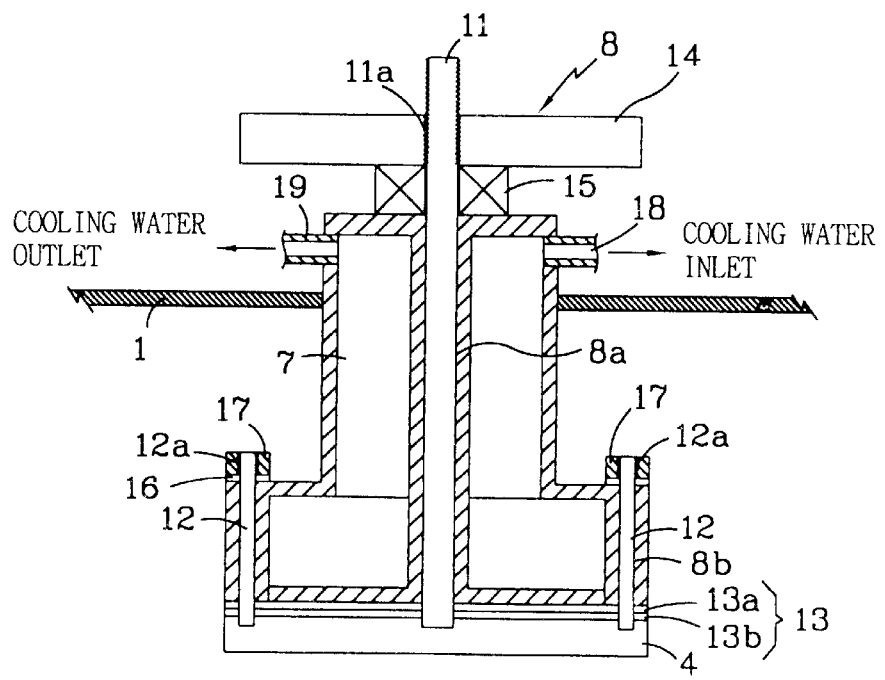
FIG. 2 is a cross-sectional view of a holder of the apparatus of FIG. 1.
Figure 3A:
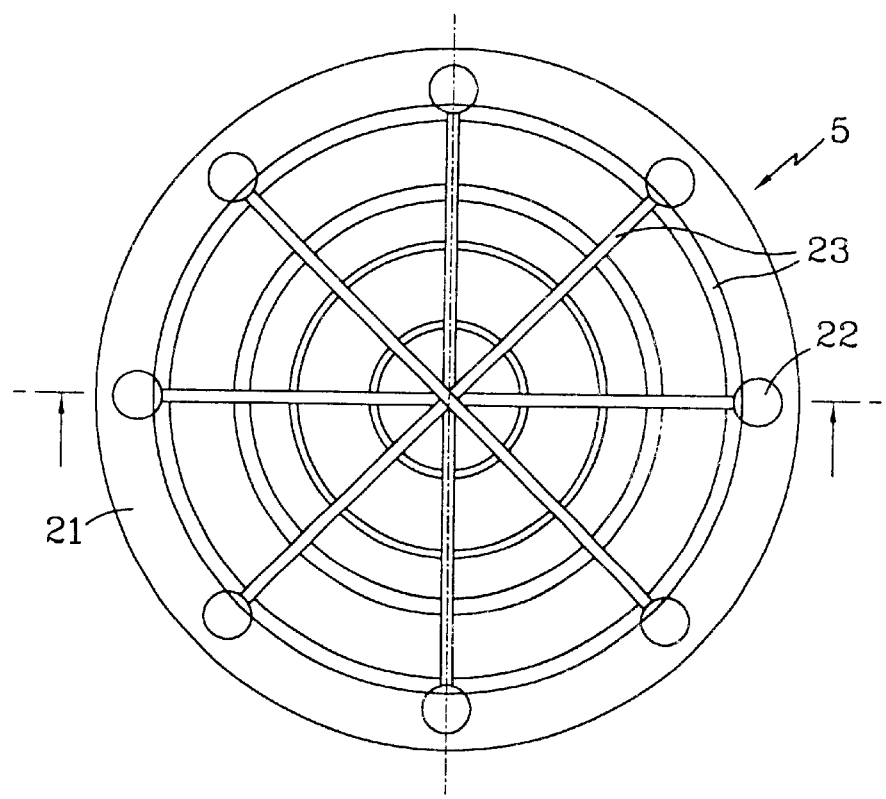
FIGS. 3a and 3b are respectively a plan view and a cross-sectional view of an anode of the apparatus of FIG. 1.
Figure 3B:
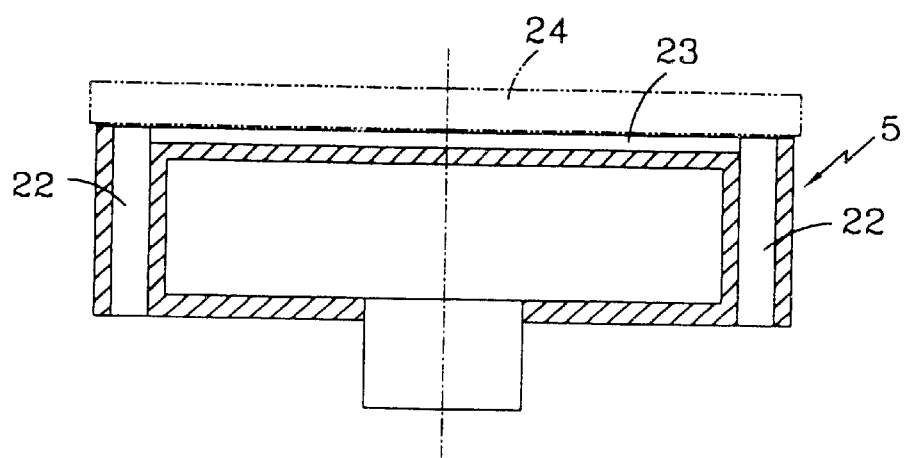

FIG. 1 is a schematic view of the construction of a diamond film deposition apparatus in accordance with the present invention, FIG. 2 is cross-sectional view of a holder 8 in the apparatus of FIG. 1, and FIGS. 3a and 3b are a plan view and cross-sectional view, respectively, of an anode 5 in the apparatus of FIG. 1.

As shown in the drawings, the diamond film depositing apparatus in accordance with the present invention is constructed with a gas inlet for injecting a reactive gas into a gas injection inlet 2 at an upper portion of one end of a process chamber 1, and a gas exhaust outlet at a lower portion of the other end of the process chamber 1 for discharging an exhaust gas after a process is performed in the chamber 1. A cathode 4 and an anode 5 each having a diameter of at least 100 mm are respectively disposed at the upper and lower portions at a predetermined spacing within the process chamber 1. The cathode 4 and the anode 5 are connected to an SMPS (Switched-Mode Power Supply) 6 so that a DC voltage can be applied thereto. A holder 8 for fixing the cathode 4 to the chamber 1 and having a cooling water line 7 for cooling the cathode 4 is disposed at an upper portion of the cathode 4.

The construction and operation of the apparatus in accordance with the present invention will now be described.

First, the holder 8 of the depositing apparatus is distinctively advantageous in that it controls a temperature of the cathode 4 without discontinuing the process and the supplied power, and maintains the temperature of the cathode 4 evenly.

As shown in FIG. 2, the cathode 4 and the holder 8 are constructed such that a central fixing bar 11 is disposed at the upper central portion of a disk-type cathode 4 made of tantalum, molybdenum or tungsten, and a plurality of edge fixing bars 12 are disposed at regular intervals along the edge.

The central fixing bar 11 and the edge fixing bars 12 are inserted in through holes 8a and 8b formed at the center and the edge of the holder 8 in a state that a spacer 13 is inserted between the cathode 4 and the holder 8. A handle 14 is threadedly engaged with a bearing 15, in a state that the bearing 15 supports the handle 14, at a threaded part 11a formed at the upper portion of the central fixing bar 11. Nuts 17 supported by spring washers 16 are threadedly engaged with threaded parts 12a formed at an upper portion of the edge fixing bars 12.

The holder 8, preferably formed of copper, includes a cooling water inlet 18 for injecting cooling water formed at one end and a cooling water outlet 19 for discharging the cooling water formed at the other end.

The reason for disposing the edge fixing bars 12 for the purpose of fixing the edge of the cathode 4 is to prevent the edge part of the cathode 4 from sagging by hundreds of μm due to the weight of the cathode 4 when it is exposed to a high temperature for a long time. If the edge part of the cathode 4 sags, it would fail to contact with the holder 8 that is cooled by the cooling water flowing through the cooling water line 7, causing the temperature of the edge part to go up, resulting in that the temperature of the cathode 4 becomes wholly uneven, definitely producing a bad effect on the diamond film deposition.

The spacer 13 is formed by folding one or plural pieces of plate having a thickness of 0.1 mm to 0.2 mm made of molybdenum, copper or stainless steel. By varying the thickness and the number of the thin spacer plates 13a and 13b, the heat transmission between the holder 8 and the cathode 4 is controlled so that the temperature of the cathode 4 is initially controlled.

The surfaces of the thin plates 13a and 13b of the spacer 13 are preferably abrasive-processed or have indentations formed therein in a regular pattern.

After reaching a synthesizing condition by generating a plasma 9, when the handle 14 is rotated to pull upward the central portion of the cathode 4 fixed to the central fixing bar 11, the heat contact is varied depending on the degree of the contact between the cathode 4, the spacer 13 and the holder 8, so that the temperature of the cathode 4 can be controlled without varying the generating power of the plasma. For instance, in case that the supply power is in the range of 30–60 kW, a possible temperature variation range of the cathode is approximately 200–300° C. The variation range of the temperature is changed depending on the material, the number of the thin plates 13a of the spacer 13, the power supplied to the plasma, or the material and thickness of the cathode 4.

Although not shown in the drawings, the cooling structure of the cathode 4 can be applied to the anode 5 in the same manner so that the temperature of the substrate 10 mounted on the upper surface of the anode 5 can be varied during the process.

The temperature of the cathode 4 is maintained below 2000° C., preferably 800–1400° C.

A result of an experiment shows that when the temperature of the cathode 4 was maintained above 2000° C., it was impossible not only to uniformly heat the cathode 4 having a diameter of larger than 1 inch but to form a uniform formation of the plasma.

Figure 4:
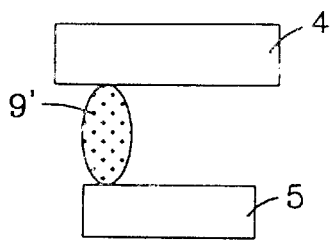
FIG. 4 is a cross-sectional view showing a form of a plasma in case of maintaining the temperature of the cathode over 2000° C.

Namely, when the cathode 4 having a diameter of larger than 1 inch was heated at the temperature above 2000° C., as shown in FIG. 4, the plasma 9' formed was contracted at a portion adjacent the cathode 4, and its diameter became uniform smaller than the cathode 4 and the substrate 10. In addition, the contact portion of the cathode 4 and the substrate 10 to the plasma 9' was intensively heated, making it impossible to maintain a constant temperature. Resultantly, it confirmed the impossibility of uniformly performing a deposition on a large substrate 10 having a diameter of larger than 4 inches.

Meanwhile, in case that the cathode 4 was heated at the temperature of 1400° C.–2000° C., the surface of the cathode 4 was severely carburized. Carburization denotes a phenomenon that the carbon constituent in a plasma gas is diffused into the surface of the cathode material and then combined with the cathode material so as to form a carbide phase. Since Carburization which forms a carburized layer accompanies a volume expansion, when the carburized layer is formed above a predetermined level in thickness, it partly comes off the surface of the cathode 4, causing the surface of the cathode 4 to be rough and nonuniform. The thusly deteriorated state of the surface of the cathode 4 causes arc generation when the plasma is generated. Therefore, in order to obtain a stable plasma, an additional process is necessary to grind the unclean carburized layer and remove it.

However, in case that the cathode 4 is maintained at the temperature of 800–1400° C., a large plasma is possible to be formed on a large substrate 10 having a diameter of at least 4 inches, and the cathode 4 having a diameter of at least 4 inches can be uniformly heated. For instance, a disk-type molybdenum cathode 4 having a diameter of 140 mm was disposed facing a disk-type molybdenum substrate having a diameter of 100 mm, with the space between the electrodes maintained at 20~40 mm. While approximately 800~1000V and 40~50A of power was being supplied between the two electrodes, a gas pressure was maintained at 130~160 torr. And, when the substrate 10 was maintained to be heated at a temperature 1150° C. while the cathode 4 was maintained to be heated at a temperature of 850~1200° C., a uniform and large plasma 9 was formed between the cathode 4 and the substrate 10 and the cathode 4 was uniformly heated.

Meanwhile, in case that the temperature of the cathode 4 goes down below 800° C., fine solid carbon granules and a coalesced solid carbon layer therefrom are acceleratedly formed on the surface of the cathode 4.

For instance, in case that the cathode 4 is maintained at the range of 950 to 1050° C., even if a gas composition of 3.5% $CH_4$—$H_2$ to $CH_4$—$H_2$ is maintained for 8 to 16 days, solid carbon granules are not formed. However, in case that the cathode 4 is maintained at 750° C.–800° C. with a gas composition of 3.5% $CH_4$—$H_2$, when only about 20 hours lapses, solid carbon granules are formed on the entire surface of the cathode 4.

Since the deposition rate of diamond film is partially decreased at the part just below the cathode where solid carbon granules were generated, the deposition of diamond film will be nonuniform. In addition, Since the solid carbon formed at 750° C.–800° C. adheres firmly on surface of cathode and its hardness is very high, it is difficult and takes long time to remove it from the surface. It is thus not desirous for the solid carbon granules to generate on the surface of cathode.

According to the present invention, power is supplied between the electrodes by a SMPS (Switch-Mode Power Supply).

Employing the SMPS itself is widely known, which is a power supply that performs a high frequency and a high-speed switching by using a switching device such as a FET (Field Effect Transistor) or IGBT(Insulated Gate Bipolar Transistor). In the field of plasma deposition, it has been mainly used for a DC sputter deposition. And, thanks to its capacity of performing a high-speed switching operation, the SMPS is considered to have an excellent function of preventing the arc generation at a sputter target during a sputter deposition.

Thus, it would be very desirous to use the SMPS as a power supply for the diamond film deposition system by DC PACVD method. Application of the SMPS technique to the DC PACVD device for diamond film deposition is not disclosed yet. The reason is believed to be that the sputter deposition process, which is the main application of the SMPS in the field of plasma deposition, has not much to do with the DC PACVD process of the present invention.

That is, first of all, the main ingredient of the plasma is different. The DC PACVD process of the present invention uses hydrogen as a main component, to which some hydrocarbon is added. Meanwhile, a main component of the plasma in the sputter process is an inert gas such as argon.

Secondly, the method of supplying a substance to be deposited on the substrate is much different. In the DC PACVD process of the present invention, the diamond source material is supplied in a gaseous state, which is decomposed by the plasma and the decomposed product is deposited on the substrate. The source material is generally a mixture of hydrogen and hydrocarbon gas. Meanwhile, in the sputter deposition process, a solid target attached to a cathode is used as an ingredient of the source material, and positive ions in the inert gas plasma collide with the target, detaching the atoms comprising the target therefrom to thereby be deposited on the substrate.

The cause of the arc generation is also different from each other. In the DC PACVD process of the present invention, the main cause of arc generation is reported to be the soot formed on the cathode, while in case of the sputter deposition process, a non-conductor material formed on the cathode is known to cause the arc generation.

As other process condition differences between the two, the DC PACVD process of the present invention requires a high gas pressure as high as 100 torr and scores of amperes of current, while the sputter deposition process requires a low gas pressure at the level of millitorr and only a few amperes of current.

In spite of the outstanding differences between the two processes, it was notably confirmed in the present invention that arcing is preventable by using the SMPS as a power supply for the DC PACVD for a diamond film deposition. Of the SMPS devices, only such an SMPS having an output voltage of 1000V at maximum and a high output current of scores of amperes can be applied to such a large diamond film deposition having a diameter of 4 inches. According to the experiment of the present invention, the reason was that in case of a substrate having a diameter of 4 inches, if the discharge current is as low as a few amperes, diamond was not deposited, or even though it was deposited, its deposition speed was very slow.

The output voltage to be 1000V at its maximum is required to maintain the output current value at a high value of over scores of amperes. An SMPS employing a FET is limited to a few amperes. Thus, an SMPS employing a IGBT is suitable to the object of the present invention, which enables the output voltage to be 1000V at its maximum and the output current to be more than scores of amperes.

When a voltage was applied between the cathode and the anode by using the SMPS employing the IGBT in the synthesizing apparatus of the present invention, it was observed that a stable plasma was maintained for a long time, whether the waveform of an applied voltage was pulsed DC or DC. The pulse form has an advantage in that the applied voltage can be increased by controlling the ratio of on-time and off-time of pulses even at the same power.

In case of using a phase-control power supply employing a conventional SCR(Silicon-Controlled-Rectifier) device rather than the SMPS, it is impossible to maintain a stable plasma for a long time because of the arcing generated between the cathode and the anode, unless it uses a ballast resistance having the same level of resistance value as that of plasma. As mentioned above, a crucial defect of the ballast resistance is that its power consumption is too much, that is, reaching scores of percent of the whole input power. Meanwhile, according to the result of our experiment, without using a ballast resistance, the plasma was stably maintained for a long time by using only the SMPS and the diamond film deposition was successfully performed on the large substrate having a diameter of as large as 4 inches.

For instance, when power of 820V and 35A was applied between a molybdenum substrate and a molybdenum cathode having a diameter of 140 mm by using the SMPS, the gas pressure of 3.5%$CH_4$—$H_2$ as used therefor was maintained at 130–140 torr, the gas flow rate was 100 sccm and the deposition time was 400 hours, a uniform plasma was formed between the cathode and the substrate. When the cathode was maintained at the temperature of 950° C. and the substrate was maintained at the temperature of 1150–1250° C., a diamond thick film having a thickness of 1.2 mm was deposited on the surface of the substrate having a diameter of 4 inches. The Raman spectroscopy showed that the FWHM(full width at half maximum) of diamond peak was in the range of 4.2 to 5.5 $cm^{-1}$.

Also, under the same conditions, when the content of methane was made 4.5% and maintained for 200 hours, a diamond film of 0.9 mm in thickness was formed.

In another embodiment, when power of 870V and 42A was applied between a molybdenum substrate and a molybdenum cathode having a diameter of 140 mm by using the SMPS without ballast resistance, the gas pressure of 6%$CH_4$—$H_2$ as used therefor was maintained at 150 torr, the gas flow rate was 200 sccm and the deposition time was 120 hours, a uniform plasma was formed between the cathode and the substrate. The diamond thick film having a thickness of 1.2 mm was uniformly deposited on the surface of the substrate having a diameter of 4 inches in the growing rate of 10 μm/hour. The Raman spectroscopy showed that the FWHM of diamond peak was in the range of 4.5 to 5.0 $cm^{-1}$.

In other embodiment, when power of 870V and 42A was applied between a molybdenum substrate and a molybdenum cathode having a diameter of 140 mm by using the SMPS without ballast resistance, the gas pressure of 4.5%$CH_4$—$H_2$ as used therefor was maintained at 150 torr, the gas flow rate was 200 sccm and the deposition time was 142 hours, a uniform plasma was formed between the cathode and the substrate. The diamond thick film having a thickness of 1.0 mm was uniformly deposited on the surface of the substrate having a diameter of 4 inches in the growing rate of 7 μm/hour. The Raman spectroscopy showed that the FWHM of diamond peak was in the range of 3.5 to 4.5 $cm^{-1}$.

According to the present invention, a diamond film can be also deposited on a curved substrate by using a curved-type electrode.

Figure 5A:
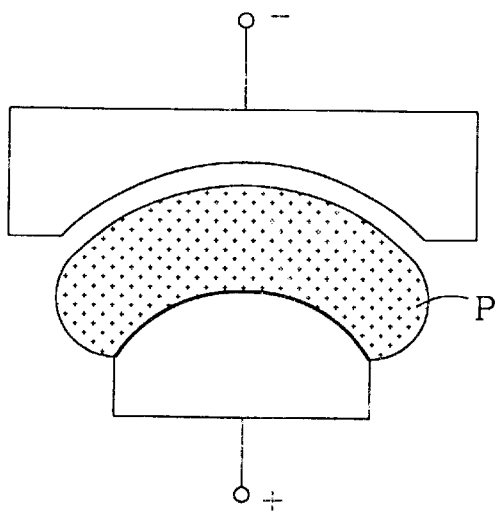
FIGS. 5a and 5b are cross-sectional views showing the state of deposition performed on a curved substrate by the depositing method of the present invention.
Figure 5B:
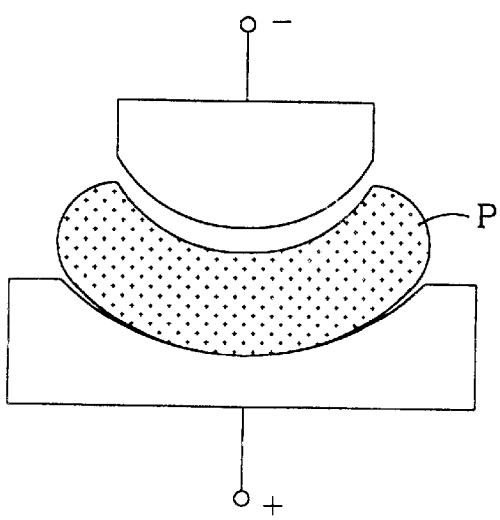
Figure 6A:
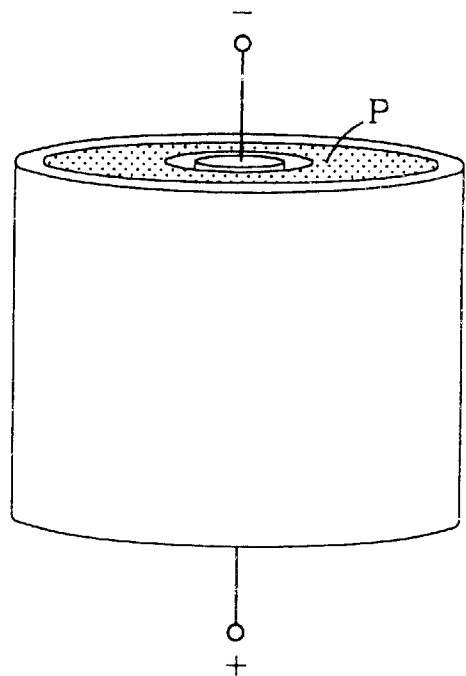
FIGS. 6a and 6b are cross-sectional views showing the state of deposition on a cylindrical substrate by the depositing method of the present invention.
Figure 6B:
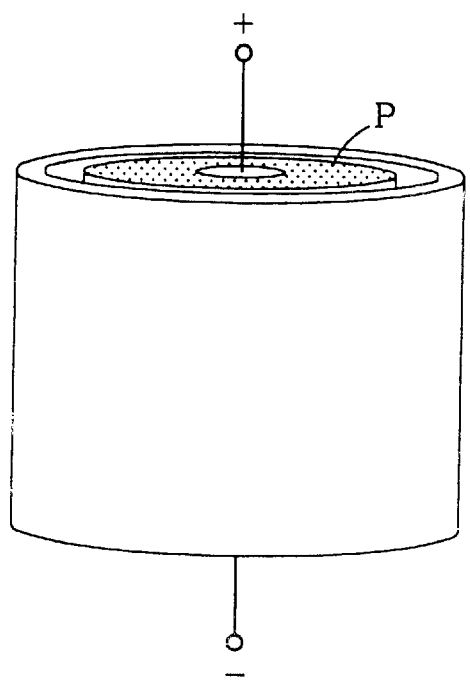

All of the known DC PACVD methods are only about the techniques of depositing diamond film on a flat substrate. However, it was observed in the experiment for the present invention that a uniform diamond film can be deposited on a curved substrate as follows. Under the same conditions, when the cathode facing the curved substrate is formed for the distance from cathode to substrate to be same at each point, a uniform plasma is formed between the cathode and the substrate, thereby forming a uniform diamond film on the curved substrate. FIGS. 5a, 5b, 6a and 6b illustrate forms of the electrodes and the plasma in case of using the curved substrate, in which the plasma P is observed with the naked eye to contact with the substrate while keeping a distance from the cathode. FIGS. 5a and 5b show convex or concave substrates, while FIGS. 6a and 6b show examples of deposition inside or outside a tube or outside a bar. In case of a curved substrate, as shown in FIGS. 5a and 5b, the cathode may have a concave-curved form while the substrate may have a convex-curved form, or the substrate can have a concave surface while the cathode has a convex surface. In this connection, the circular arcs of making the sections of the cathode and the surface of the substrate are preferably concentric.

For instance, referring to FIG. 5a, the upper surface of a molybdenum disk-type plate having a thickness of 30 mm and having a diameter of 70 mm is processed to be a convex-curved substrate having a radius of curvature of 45 mm and a central part of a molybdenum disk-type plate having a thickness of 30 mm and having a diameter of 120 mm is processed to be a concave-curved cathode having a radius of curvature of 70 mm. The central axes of the substrate and the cathode are positioned to congruously face each other, and the central point of the concave-curved surface of the cathode and that of the convex-curved surface of the substrate are distanced at 26 mm. A mixture of hydrogen and 3% to 5% of methane is supplied thereto at a gas pressure of 100 torr, and power of 800–900V and 25–35A is supplied between the cathode and the substrate, so that a uniform plasma is formed between the cathode and the substrate. After a predetermined time lapses, a uniform diamond film is deposited on the substrate.

Likewise, in case of using a curved-type cathode or substrate, it is desirous to suitably modify the form of the holder so as to make the temperature of both the cathode and the substrate even. For example, when a cathode is concave in its center, as shown in FIG. 5a, it is preferable for the holder to have such a structure that the edge part of cathode can be cooled more actively than its central part. For example, concentric grooves may be formed at the part contacting with an upper surface of the plate of the cathode in a manner that the intervals between the grooves are longer in the central part so that the central part of the lower surface of the cathode has a smaller contact area than the edge part.

In case of coating an inner surface of a tube, as shown in FIG. 6a, a bar-type or tube-type cathode is placed at the position of the central axis of the tube to be coated, so as for its central axis to be congruent. In case of coating an outer surface of the tube, or bar as shown in FIG. 6b, a tube-type cathode, having a diameter larger than the tube or the bar to be coated, is placed at an outer surface of the tube or the bar to be coated, in the same manner that the two central axes are congruent to each other. By using such a structure, when a voltage is applied between the electrodes, a cylindrical plasma is formed between the cathode and the substrate, thereby depositing the diamond film on the substrate. At this time, the cathode and the substrate are preferably cooled by using a water-cooled holder so that the desirous temperature range as mentioned above can be maintained.

One of the advantages of the present invention is that it is possible to deposit a diamond film having a diameter of larger than 4 inches uniformly on a substrate with low heat conductivity that is light, thin and weak like a silicon wafer, by using the DC PACVD method.

According to the experiment for the present invention, in the method where a silicon substrate was merely laid on the upper surface of an anode so as to be mounted by gravity force, it was impossible to evenly maintain the temperature of the silicon substrate. For example, since a molybdenum or tungsten substrate in use usually has a high specific gravity and is of over a few mm in thickness, its weight itself produces a close contact with the anode. Also, since its heat conductivity is higher than that of the silicon substrate, the temperature was evenly maintained. However, in the case of a silicon substrate in use for semiconductor fabrication, since it has a low specific gravity and is thin, having a thickness of only a few mm, the substrate's weight itself doesn't help to make a close contact with the anode. In addition, due to its low heat conductivity, when it is contacted by a plasma, the uneven heating gets worse. Moreover, owing to its thinness and a low melting point, the substrate bows concave upward because of an internal stress of the diamond film while the diamond film is being deposited. Consequently its contact with the anode becomes nonuniform, causing a severe unevenness in temperature. The degree of bowing increases in proportion to the thickness of the diamond film.

In order to solve the problems described above, in the present invention, an anode of a vacuum chuck type is used to attain an effectively close thermal contact between the silicon substrate and the anode, so that the temperature of the substrate can be maintained evenly during synthesizing, and the substrate can be effectively vacuum-clamped onto the upper surface of the anode, to thereby prevent the substrate from bowing or coming off, resulting in that a stable and large-area deposition is obtained on the silicon substrate by the DC PACVD.

FIGS. 3a and 3b illustrate the structure of the anode, in which a plurality of vacuum holes are formed in an upper surface of a body 21 of the anode 5 at regular intervals, and plural vacuum grooves 23 are radially and concentrically formed in different-sized circles in an upper surface of the body 21 to be connected to the vacuum holes 22.

Namely, as shown in broken lines, during the process, when the vacuum is drawn through the vacuum holes 22 in a state that the silicon substrate 24 is mounted on the surface of the body 21, the silicon substrate 24 is uniformly and clampedly fixed to the upper surface of the body 21.

As so far described, in the diamond film depositing apparatus and its method of the present invention, a uniform and large plasma is formed on the substrate having a diameter of larger than 100 mm without using a heated filament cathode, without applying a magnetic field thereto, and without using a ballast resistance, and the thusly formed the plasma is stably maintained for a long time, so that a diamond thick film having a diameter of larger than 4 inches and a thickness of over hundreds of $\mu$m can be deposited on a flat or curved substrate and also on a Si wafer.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A diamond film depositing method by plasma-assisted CVD comprising the steps of:

applying a DC or DC pulse voltage with SMPS to a cathode and an anode which are facing each other and disposed inside a vacuum chamber, wherein the cathode and the anode are of disk-shape, the cathode being comprised of at least one of tantalum, molybdenum and tungsten, and a substrate is disposed on the anode;

generating a plasma between the cathode and the substrate by supplying a reactive gas including hydrocarbon gas therebetween; and depositing a diamond film on the substrate while maintaining the temperature of cathode greater than 950° C. and below 1400° C. and maintaining the pressure of the reactive gas in the range of 100–160 Torr.

wherein the cathode is fixed by a holder which includes a central fixing bar disposed at a center of an upper surface of the cathode, plural edge fixing disposed at an edge of the upper surface of the cathode at regular intervals, and a cooling line formed inside the holder, and the temperature of the cathode is controlled by varying contact spacing between the cathode and the holder.

2. The method according to claim 1, wherein the reactive gas is a mixture of hydrocarbon and hydrogen.

3. A diamond film depositing method by plasma-assisted CVD comprising the steps of:

applying a DC or DC pulse voltage with SMPS to a cathode and an anode which are facing each other and disposed inside a vacuum chamber, wherein the cathode, the anode and a substrate on the anode are concave and convex with respect to each other, the cathode being comprised of at least one of tantalum, molybdenum and tungsten, and a substrate is disposed on the anode;

generating a plasma between the cathode and the anode by supplying a reactive gas therebetween; and depositing a diamond film on a substrate while maintaining the temperature of cathode between 950° C. and below 1400° C. and maintaining the pressure of the reactive gas at the range of 100–160 Torr, wherein the cathode is fixed by a holder which includes a central fixing bar disposed at a center of an upper surface of the cathode, plural edge fixing bars disposed at an edge of the upper surface of the cathode at regular intervals, and a cooling line formed inside the holder, and the temperature of the cathode is controlled by varying contact spacing between the cathode and the holder.

4. The method according to claim 3, wherein the reactive gas is a mixture of hydrocarbon and hydrogen.

* * * * *